United States Patent [19]

MacDonald

[11] Patent Number: 5,406,565
[45] Date of Patent: Apr. 11, 1995

[54] MEMORY ARRAY OF INTEGRATED CIRCUITS CAPABLE OF REPLACING FAULTY CELLS WITH A SPARE

[75] Inventor: Neal H. MacDonald, Durham City, England

[73] Assignee: MV Limited, Durham City, England

[21] Appl. No.: 781,252

[22] PCT Filed: Jul. 6, 1990

[86] PCT No.: PCT/GB90/01051
§ 371 Date: Dec. 31, 1991
§ 102(e) Date: Dec. 31, 1991

[87] PCT Pub. No.: WO91/01023
PCT Pub. Date: Jan. 24, 1991

[30] Foreign Application Priority Data

Jun. 7, 1989 [GB] United Kingdom ............... 8915543
Aug. 8, 1989 [GB] United Kingdom ............... 8918126

[51] Int. Cl.⁶ ............................................. G06F 11/00
[52] U.S. Cl. .................................. 371/10.3; 371/8.1
[58] Field of Search ............... 371/10.3, 11.1, 10.1, 371/10.2, 21.6, 29.1, 8.1, 10.2, 15.1; 364/245.3, 255.7, 955.5, 970.1

[56] References Cited

U.S. PATENT DOCUMENTS

| | | | |
|---|---|---|---|
| 3,735,368 | 5/1973 | Beausoleil | 340/173 |
| 4,556,975 | 12/1985 | Smith et al. | 371/10 |
| 4,584,681 | 4/1986 | Singh et al. | 371/10 |
| 4,639,897 | 1/1987 | Wacyk | 365/200 |
| 4,656,610 | 4/1987 | Yoshida et al. | 365/200 |
| 4,849,938 | 7/1989 | Furutani et al. | 371/10 |
| 5,195,057 | 3/1993 | Kasa et al. | 365/200 |

OTHER PUBLICATIONS

Sy-Yen Kuo et al., Efficient Spare Allocation for Reconfigurable Arrays, Feb. 1987, pp. 24-30.

*Primary Examiner*—Charles E. Atkinson
*Assistant Examiner*—Norman M. Wright
*Attorney, Agent, or Firm*—David P. Gordon

[57] ABSTRACT

A fault tolerant data storage system comprises an array of memory chips having a plurality of rows and columns, each row of memory chips CO to CN having a spare chip CS. Each chip comprises an array of memory locations some of which may be faulty. When simultaneously writing or reading data via parallel data lines DO-DN to the respective chips, a map MAP identifies any chip having a fault in the addressed location (e.g. in the addressed column) and connects the data line to a good location in the spare chip. The logical addresses for the chips are skewed differently for each other as compared with their physical addresses, such that there are not coincident faults in the different chips e.g. only a single chip in a row has a fault in the columns being simultaneously addressed in the respective chips of that row.

8 Claims, 15 Drawing Sheets

MEMORY ARRAY OF INTEGRATED CIRCUITS CAPABLE OF REPLACING FAULTY CELLS WITH A SPARE

BACKGROUND OF THE INVENTION

This invention relates to a data storage system which comprises an array of integrated circuits or semiconductor chips, each such chip including a memory consisting of an array of memory locations some of which may be faulty.

Memory chips suffer from a small number of faults which can arise during manufacture or can develop subsequently. Systems have been devised which can tolerate such faulty chips. The commonest form of fault tolerance in use is the incorporation of spare rows and columns of bits into each memory chip. After manufacture the defective row or column is identified by chip testing, and the spare/s programmed to replace the defective element. The programming is permanent, using e.g. laser cutting or electrical fuse blowing. This has proved to be a successful technique and is in use today by all memory manufacturers, see the review paper "Redundancy—the new device technology for circuits of the 80's", R. J. Smith, International Electron Devices Meeting, December 1982.

The so-called redundancy approach does suffer from limitations especially in the early part of a memory product manufacturing life cycle. The manufacturer has to predict the numbers and type of faulty elements, expected as a result of a specific manufacturing process, in order to design the appropriate number of spare rows and columns. The manufacturer's choice of spares is constrained by limits imposed by chip area and performance. Furthermore the programming technique may restrict the efficiency of element replacement. The programming is permanent, hence there is no provision for faults developing after some period of operational use.

An alternative approach is described in GB 2 184 268. Instead of trying to manufacture perfect storage devices by repairing imperfect chips in the factory (redundancy), it was proposed that imperfect devices be salvaged and only their good bits used. The technique suffers from one main drawback. During data transfer, large blank gaps will periodically appear. Whilst for a local computer these gaps could be identified and input or output suspended, a more remote system would have difficulty in stopping and starting. These gaps lead to a greatly reduced data transfer rate. A further disadvantage is a reduction in storage capacity.

SUMMARY OF THE INVENTION

In accordance with this invention, there is provided a fault tolerant data storage system which comprises an array of integrated circuits, each integrated circuit including a memory consisting of an array of memory locations some of which may be faulty, the system having means for addressing a plurality of integrated circuits in a row simultaneously for writing or reading data via parallel data lines, and means for identifying faulty locations and for connecting the data line for a faulty integrated circuit to a good location in a spare integrated circuit, the logical addresses for the integrated circuits being skewed differently for each other as compared with their physical addresses.

A typical memory chip comprises a two dimensional storage array of n columns along the horizontal axis and m rows along the vertical axis. A typical manufacturing fault will affect one or more columns and/or rows.

In the embodiments of this invention to be described herein, columns (or clusters of individual bit faults) are recovered by switching from faulty columns to good columns (spares) on-the-fly. This so called 'dynamic sparing' is effective because modern memory devices have large numbers of columns (typically greater than 512). The spare columns are provided by an extra chip added to each row of the storage array.

During data transfer it is the column location that is addressed most frequently hence dynamic column sparing (DCS) has to operate autonomously at high speed. Since rows represent convenient data blocks a faulty row is spared before any transfer begins and used for the period of the transfer.

Row recovery is similar to DCS described above, and is known as Pre-emptive Row Sparing (PRS). PRS uses a spare row of chips to replace the faulty rows of the chips in the arrays, however the sparing takes place before the commencement of data transfer, and the spares selected remain in use until data transfer has been completed.

The recovery performance of DCS and PRS has been evaluated over a realistic range of fault population, memory type, and array size. The combination of DCS and PRS has been shown to achieve 100% recovery, where 100% represents the maximum storage (ignoring faults) of the chip array, excluding spares.

The present invention achieves 100% storage recovery even if all the chips in array are defective, even the spare chips. However the sparing techniques can only operate with faults that occupy unique logical locations, since each faulty location is mapped into one of n or m locations in the spare chip/s. A major feature of the present invention is the ability to manage these faults that occupy the same phyical location in different chips since the normal address sequence during data transfer is skewed to move the coincidental physical location to a different logical location in time.

The invention herein uses factory programmed maps of faulty column and row locations and skew numbers. If a fault develops during field operation the fault maps and skew numbers can be re-programmed so providing field failure tolerance.

Also in accordance with this invention, there is provided a method of testing an integrated memory circuit, comprising testing the integrated circuit to detect faulty memory locations and providing a printed record of the fault locations, which record is packaged with the integrated circuit and which is readabe an optical read-out machine. The optical machine-readable record may be printed directly on the chip, or may be printed onto a label which may be adhered to the chip or otherwise packaged with it. In this manner, the chip carries with it, from the chip manufacturer, the record of its fautls which is needed when assembling the chip array.

Embodiments of this invention will now be described by way of examples only and with reference to the accompanying drawings, in which:

DETAILED DESCRIPTION OF THE PREFERRED EMBODIMENTS

Figure 1:
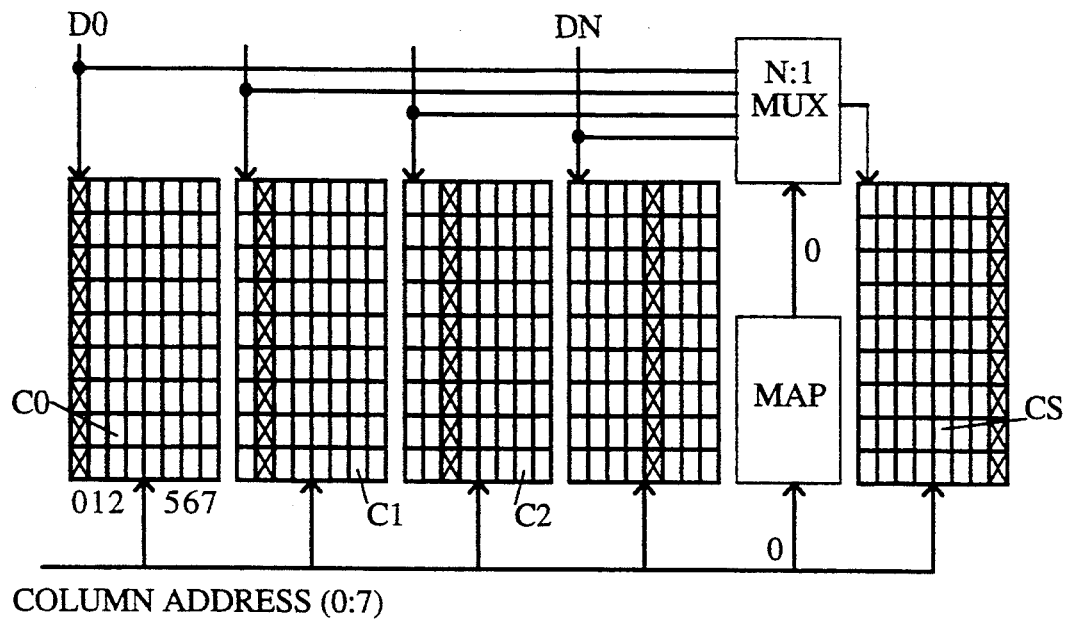
FIG. 1 shows a row of chips in a storage system, for explaining the principles on which this invention is based.

A data storage system comprises an array of memory chips consisting of a plurality of columns and a plurality of rows. FIG. 1 shows one such row of chips C0 to CN, together with a spare chip CS for the row. Each chip comprises an array of memory locations, consisting of a plurality of columns and a plurality of rows. Parallel data received on lines D0 to DN is applied to the respective ones of the main chips simultaneously once an array row and a chip row have been selected for all chips (including the spare). The first data word is written to row 0, column 0 of all the main chips simultaneously, the second data word is written to row 0, column 1 of all main chips simultaneously, and so on. Thus once an array row and a chip row have been selected, the column address is incremented across the width of the respective chips, then the next chip row is selected and the process continues.

Any chip may contain faults. These may consist of a number of faulty memory locations within a column (in which case the chip can be regarded as having a faulty column), or a number of faulty memory locations within a row (in which case the chip can be regarded as having a faulty row), or a single faulty memory location (in which case the chip can be regarded as having either a faulty column or a faulty row).

FIG. 1 shows one faulty column in each chip, chip 0 having a faulty column 0 for example. A map MAP stores data indicating which chip has a faulty column in the column being addressed at any instant. For example, when columns 0 of all chips are being addressed simultaneously, the map MAP indicates that chip 0 has a faulty column at this address. The map MAP controls an N:1 multiplexer MUX (to which all data lines are connected) to connect data line 0 to the addressed column 0 of the spare chip CS at the end of the array row. The data bit on line 0 is thus copied into the currently-addressed column of the spare chip.

Figure 2:
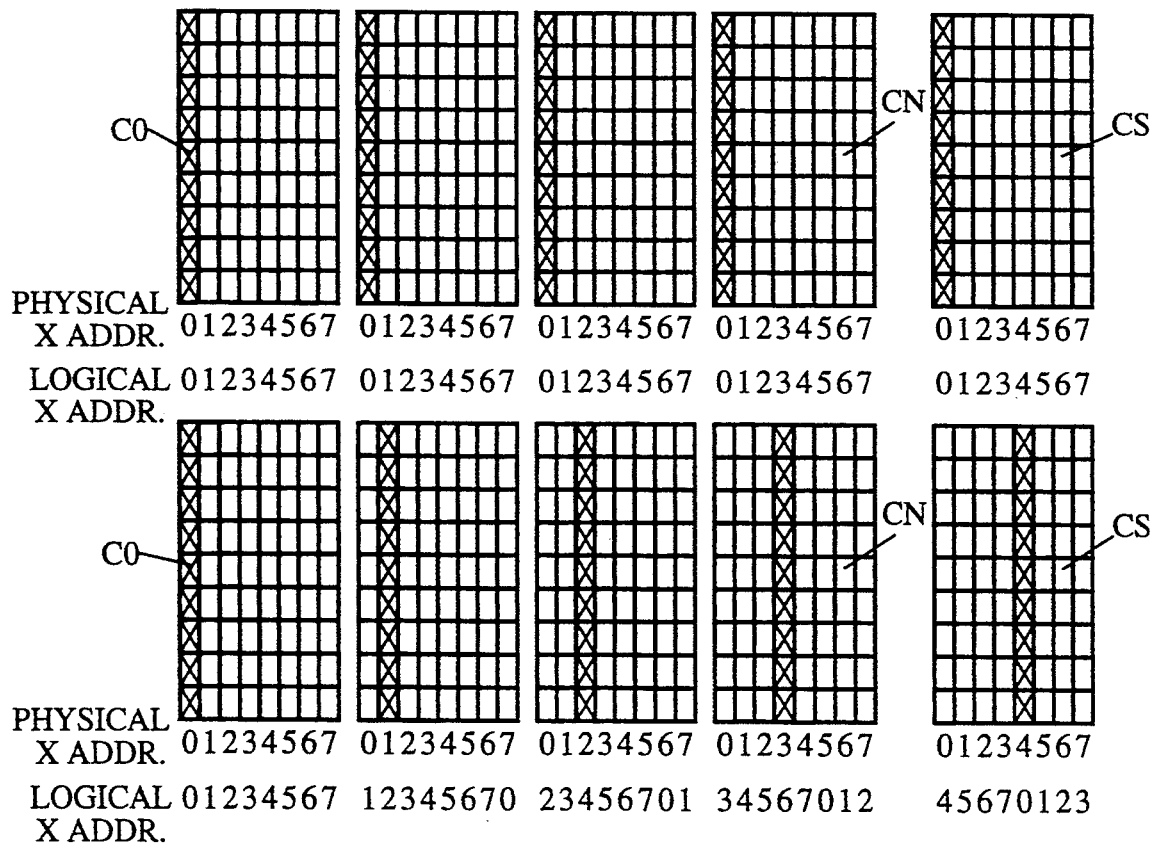
FIG. 2 shows two rows of chips in a storage system to explain the principle of logical address skewing which is used in this invention.

The arrangement of FIG. 1 cannot however cope if more than one chip has a fault in the same column (e.g. two chips have a faulty column 0), i.e. column coincidence. Accordingly, the logical addresses of the chip columns within a row are skewed relative to each other in a manner which ensures that there will be no such coincidence. This is illustrated in principle in FIG. 2. In the upper row, all the main chips have a faulty column 0, and so also does the spare chip. If the logical address were to correspond to the physical address, then the coincidences of faulty columns would prevent effective operation. Instead, as shown in the lower row, the logical addresses of the different chips are skewed relative to each other in a manner which ensures that, for any logical address, there is no more than one chip which has a faulty column in the corresponding physical column location. For example, logical address 0 finds a faulty column (physical location 0) in the first chip but in no other chip; logical address 2 finds a faulty column in chip 2 only; logical address 3 finds no faulty columns in any chip, and so on.

Faulty rows can be handled in a similar manner, although the row sparing preferably takes place before data transfer rather than on-the-fly. Detailed arrangements for both column sparing and row sparing will be apparent from the following description.

Figure 3:
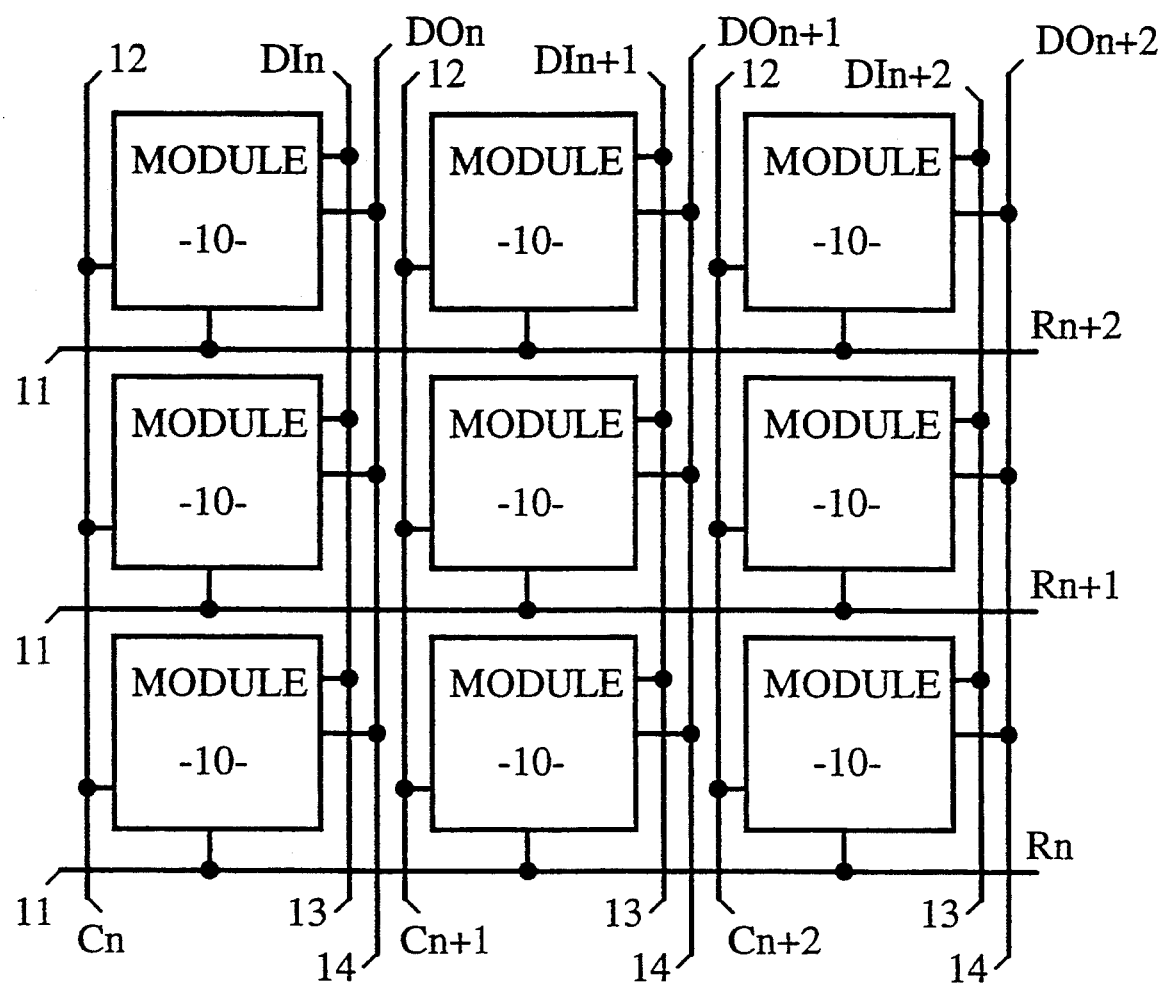
FIG. 3 shows an array of modules in accordance with our International application PCT/GB0/00539.
Figure 12:
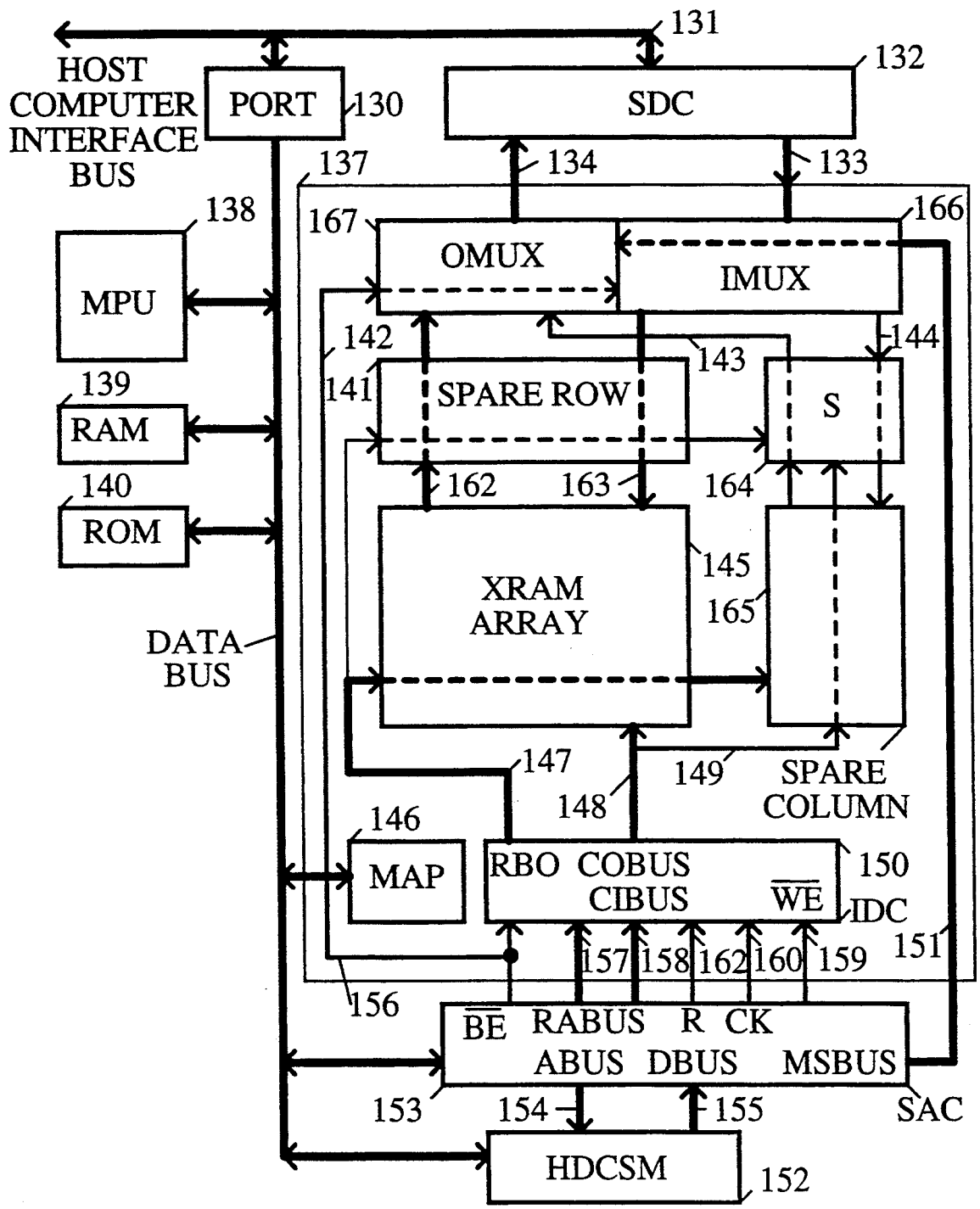
FIG. 12 is a block diagram of a first embodiment of data storage system in accordance with this invention.

A first embodiment of data storage system in accordance with this invention is shown in FIG. 12 and is based on a control system disclosed in our International patent application PCT/GB90/00539. That control system will be described first. Thus, our application PCT/GB90/00539 describes a control system which connects control signals to modules in an array as a cross point network. FIG. 3 describes such an array connected to R 11 (horizontal) and C 12 (vertical) control lines. The data path connections, DI 13 and DO 14 are separate from the control network. In accordance with this invention the modules are RAMs that incorporate circuitry to support the R and C protocol, and are termed XRAMs. The array is inactive until both the R and C signals of a particular XRAM are asserted. Once asserted the XRAM site becomes active, and provided that neither R and C are negated together, the XRAM site is capable of receiving, decoding and executing commands using the C line to transmit serial command data, and the R line to act as a synchronising clock. The XRAM comprises a DRAM with additional circuitry and preferably the device is arranged so that it can be used either as an XRAM or as a conventional DRAM, by appropriate connections to its pins. In the first embodiment the device is used as an XRAM.

In accordance with this invention, a control system is used to program address information into individual XRAMs within the array. In most cases one R line (for a specific row of XRAMs) is asserted, along with all the C lines of the array. Serial data appearing on any C line does not have to be identical to that of any other C line.

Figure 4:
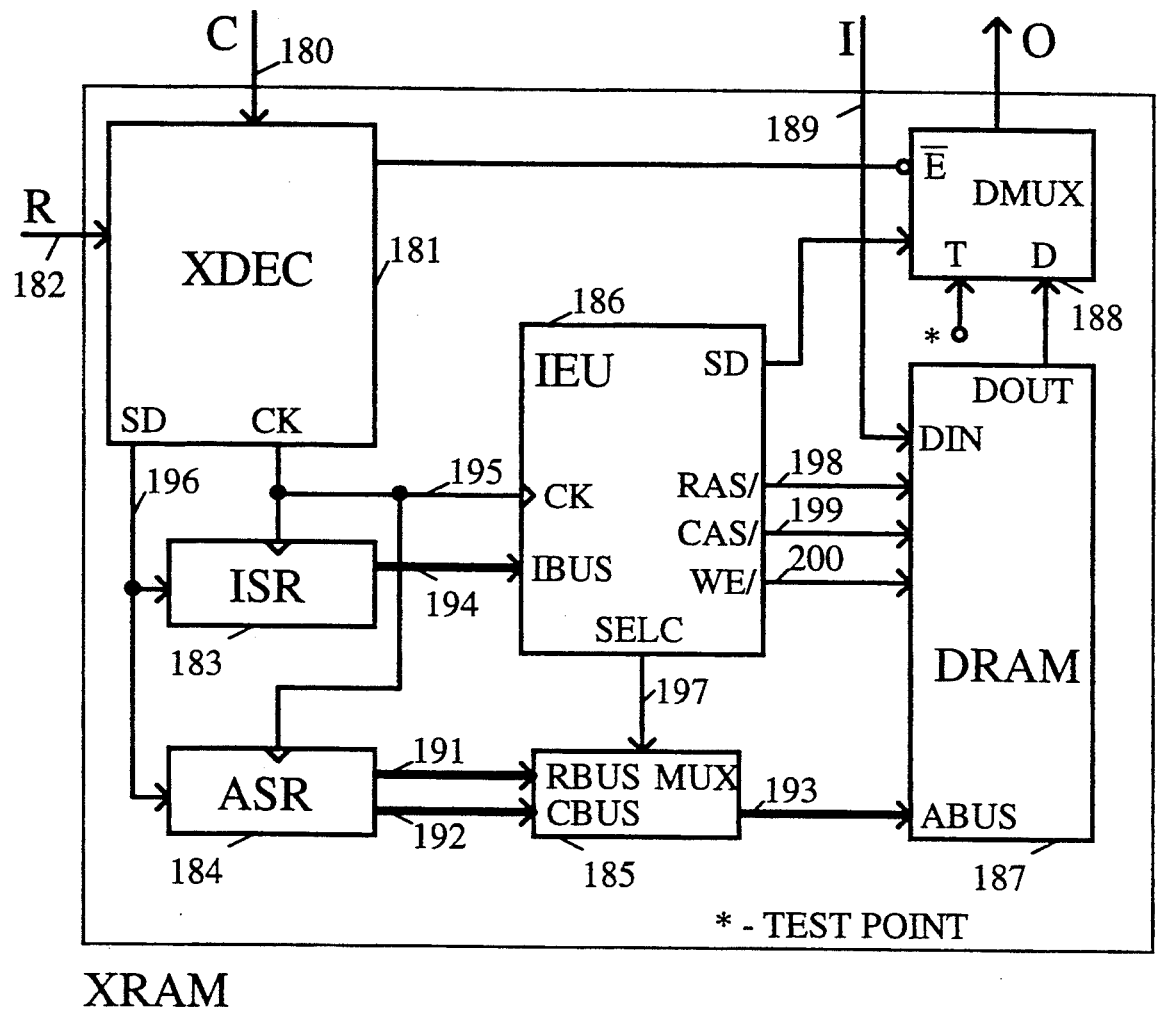
FIG. 4 shows one of the modules of FIG. 3 modified to form an XRAM.

A typical XRAM is shown in block diagram form in FIG. 4. A decoder circuit XDEC 181 is connected to the cross-point of a R 182 and C 180 line in an array. The XDEC determines if both R and C are asserted (chip selected), generates clock timing from the R line, and staticises data on the C line. The XDEC sends data SD 196 appearing on the C line to the instruction storage register ISR 183 and to the address storage register ASR 184. The ISR latches a serial data packet and drives the instruction bus IBUS 194 after the data has been latched into the instruction execution unit IEU 186. The IEU is responsible for determining when ISR and ASR have been loaded and to initiate execution of the decoded instruction on IBUS. The IEU generates all signals required by the DRAM 187. A data multiplexer DMUX 188 routes data from the DRAM or various test points to the output terminal.

Figure 5:
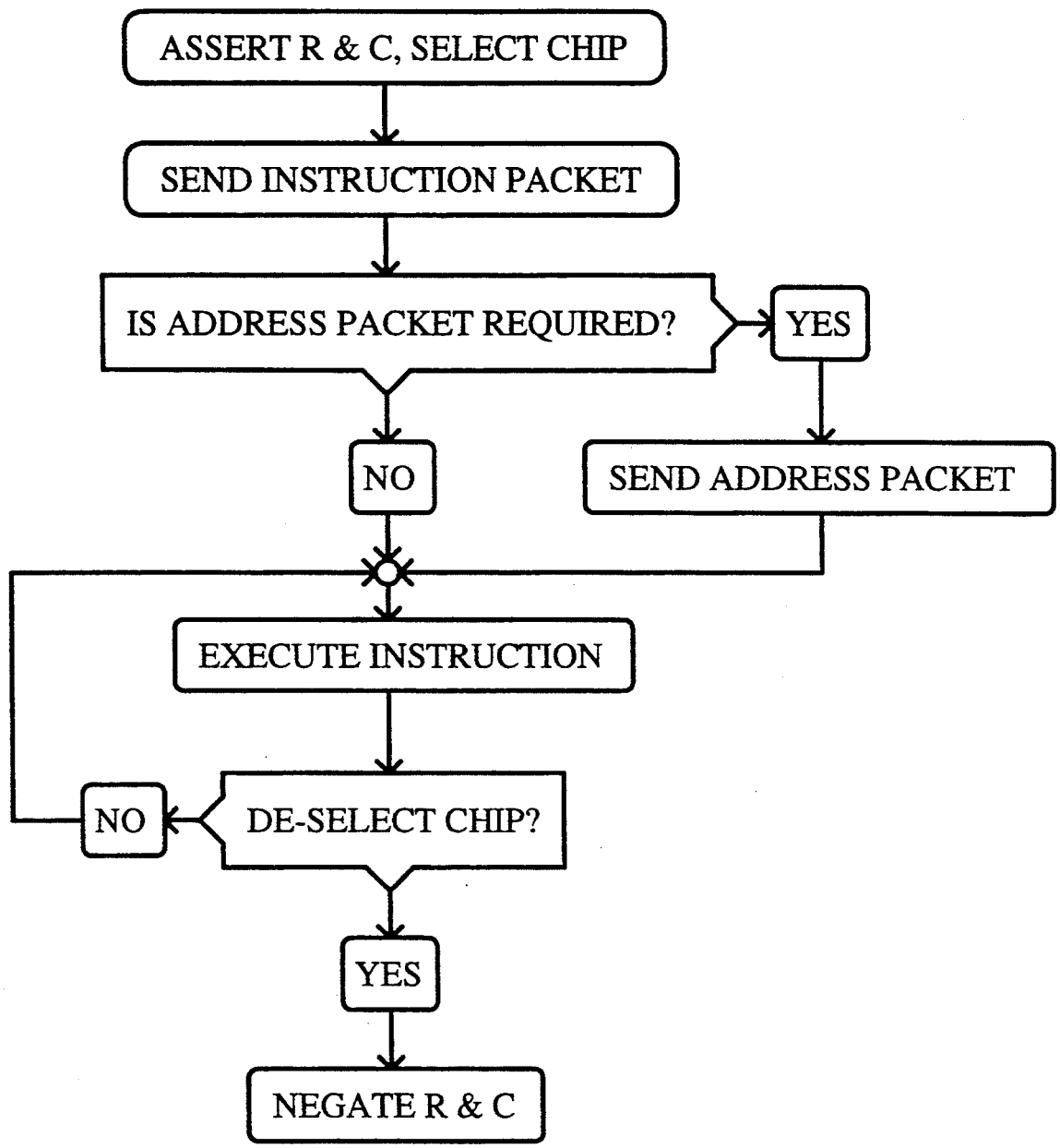
FIG. 5 is a flow diagram to show XRAM selection, command decode and execution.

A typical XRAM selection/execution sequence is shown in FIG. 5. Instruction packets are sent over the C lines immediately following chip selection. There is an option to send an address packet defining the column, row, or column and row, from where the initial data transfer will commence. The instruction packet can be encoded in a plurality of ways. PCT/GB90/00539 describes a list of possible commands such as Fast Page Mode Write (PMWT). Page mode is a typical data transfer mode and essentially operats while the row address within a memory is held constant, while column addresses along the selected row are sequenced at high speed. The instruction packet is decoded to produce the signal timing required by the XRAM to invoke the particular data transfer mode required. Ececution of a particular mode is clocked by the R line connected to the row of chips selected. Instruction execution is described in PCT/GB90/00539 and is carried out by the instruction execution unit (IEU) within each chip.

Since during instruction execution the C line is asserted but inactive (not undergoing return-to-one transitions), it is free to supplement the actions of the IEU. This will require an additional instruction to the typical but not exhaustive list given in PCT/GB90/00539. All instructions shown in the list generate signals required by the DRAM in response to the clock transitions appearing on the R line. These signals include a Write Enable signal which is either on or off informing the DRAM to write and read respectively. The additional instruction is identical in operation to PMWT except the write enable signal is not generated locally by the IEU. Instead the Write Enable signal is supplied remotely by the C line. This additional instruction allows the optional writing of any column location and can be selected on-the-fly and is known as the Remote Write mode.

Figure 6:
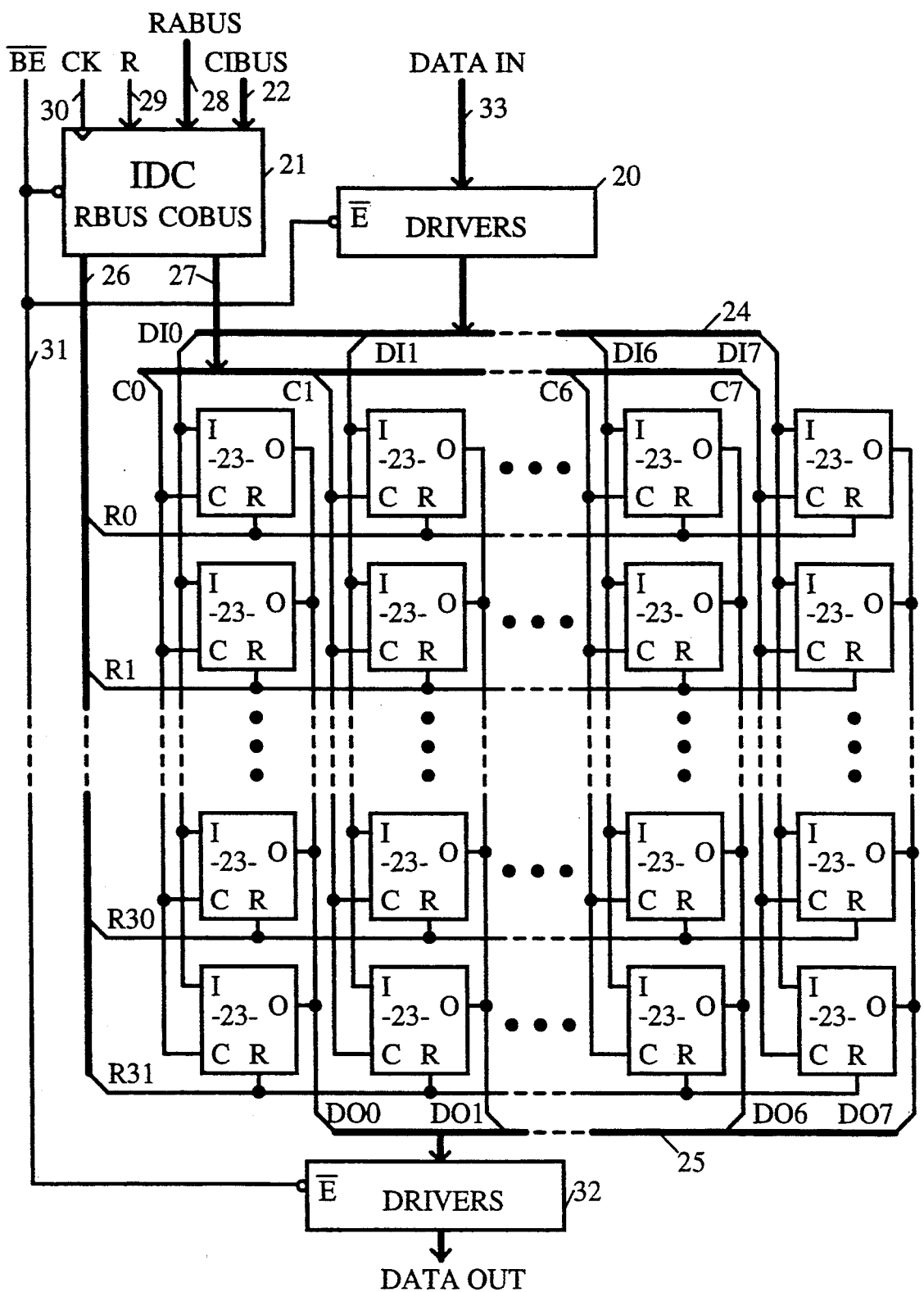
FIG. 6 shows one possible arrangement for the interconnection of an array of XRAMS.

FIG. 6 illustrates an array of XRAMs 23 connected at the cross points of individual R 26 and C 27 control lines. A possible arrangement is eight C lines and 32 R lines. The R and C signals are generated by the integrated driver circuit IDC 21. Due to the characteristic reduction in pin-out of the XRAM only a single integrated circuit is required to drive all the R and C lines of the array. Accordingly the timing skews between R and C signals can virtually be eliminated. The IDC is supplied with an R address bus (RABUS) 28 that selects one of a plurality of R output lines (RBUS) 26. The R input 29 is the source of R signal timing. R is re-timed by CK 30 and is transmitted to one of the RBUS lines. The C input Bus (CIBUS) 22 supplies one input per C line of the array. The CIBUS transmits serial data to the individual C lines, hence different chip columns can receive different C data. CIBUS signals are re-timed by the CK 30 input and transmitted to the C output bus (COBUS) 27.

The control path of the array is separate from the data path. The data path consists of data in driver 20 connected to the input pins of the XRAMs, and the data out driver 32.

Figure 7:
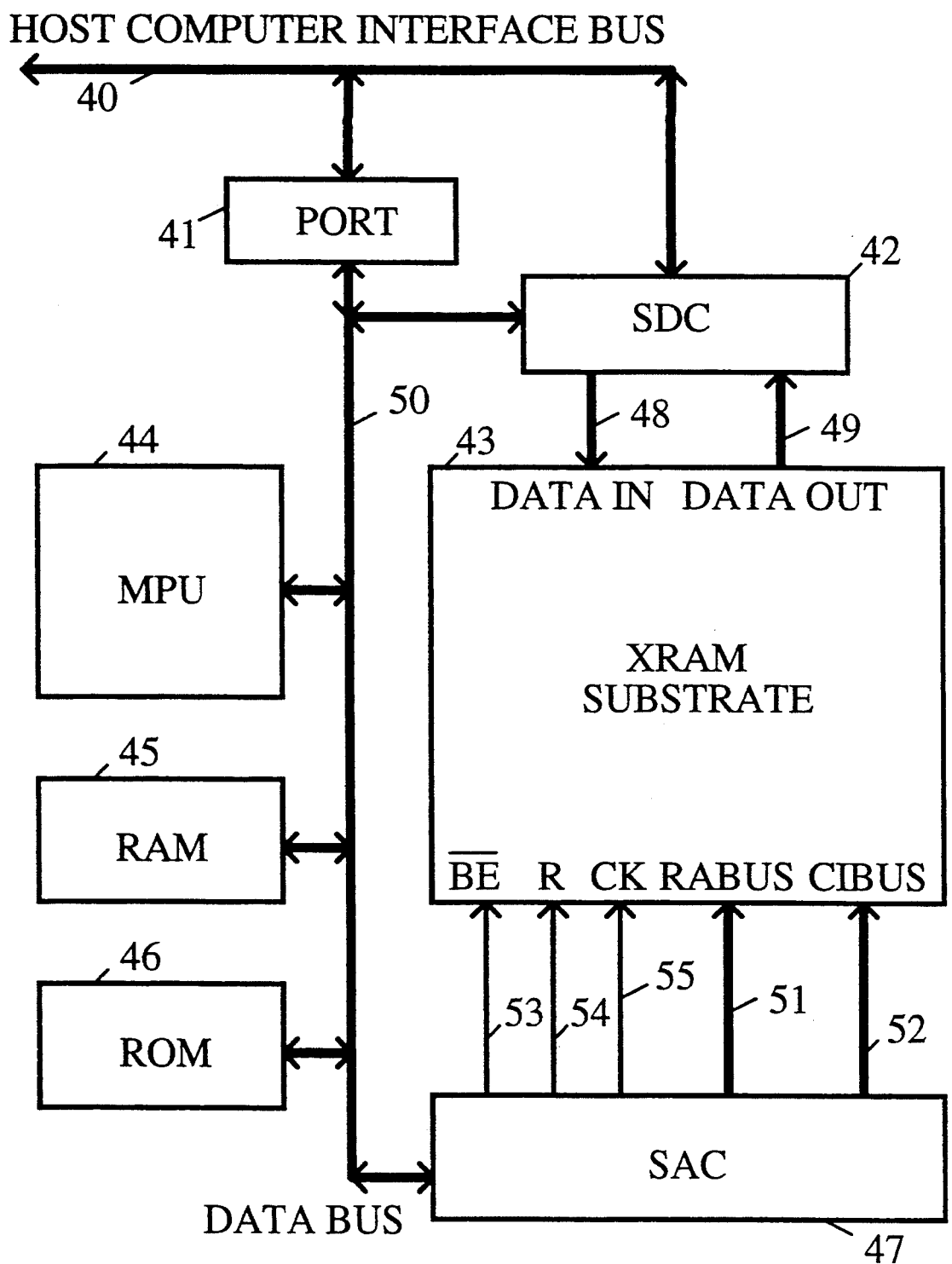
FIG. 7 shows a storage system which incorporates an array of perfect XRAMS.

FIG. 7 shows a storage system comprising a microprocessor (MPU) 44 based controller connected to an XRAM substrate 43. Only data paths are shown. Address and memory mapping signals are assumed. Only one substrate is shown for clarity, though plural sustrates are possible (using additional board enable lines BE/53). The storage system is connected to a remote computer by the host computer interface bus (HCIBUS) 40. The HCIBUS is responsible for sending messages to the MPU via the memory mapped interface port 41 requesting data transfer and sending block address descriptors, known as logical block numbers (LBNs). LBNs are typically a contiguous sequence of numbers from 0 to N.

Storage data is transmitted directly to the HCIBUS after a suitable message protocol between the MPU 44 and host computer has been observed. Storage data is read or written to the XRAM substrate via the system data controller SDC 42. The SDC is responsible for HCIBUS control and error detection and correction (EDC). Neither HCIBUS protocol nor SDC EDC is described here since there are many published methods available.

The XRAM substrate is controlled by the system access controller (SAC) 47. The SAC is responsible for formatting the C data supplied to each substrate and for substrate, array row, and internal XRAM row selection.

Once the starting address within a chip (a function of LBN) has been decoded data transfer commencess from a selected row of XRAM, within a selected substrate. Block sizes can be conveniently set to the length of a row within an XRAM (typically 512, 1024, or 2048). Data transfer starts at the beginning of a row within an XRAM and stops at the end. A binary counter within each XRAM supplies the column address sequence during data transfer.

Figure 8:
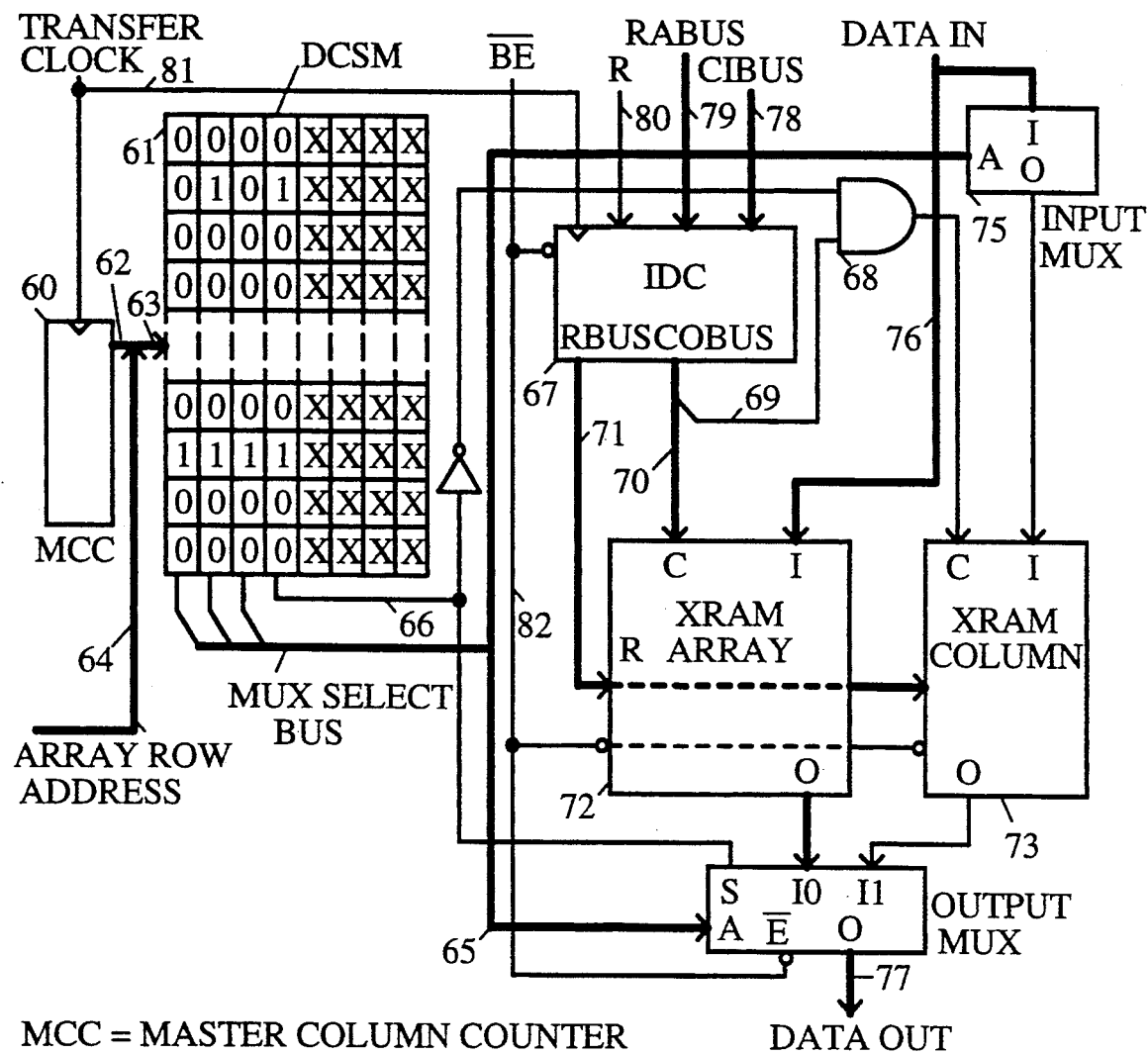
FIG. 8 is a diagram to explain further the principle of dynamic column sparing.

The storage system shown in FIG. 7 assumes perfect XRAM chips. However, the system of FIG. 12 in accordance with this invention can tolerate faults in XRAM columns and/or rows. As faulty columns are addressed information describing the faulty address directs multiplexers in the data path of the substrate to redirect data into or out of a good column in the spare XRAM. This information is determined during manufacture and permanently stored in a non-volatile memory on each substrate. This mapping of faulty column addresses on-the-fly eliminates any data throughput losses. A block diagram to explain the dynamic column sparing system is shown in FIG. 8. Single or clustered bits are managed in the same way as faulty columns.

In FIG. 8 the dynamic column sparing map (DCSM) 61 is a look up table addressed by a master column counter (MCC) 60 which generates a sequence of column addresses from the start of the row to the end. The MCC 60 is clocked by a transfer clock 81 which is the synchronising signal for data transfer to or from the array 72. The DCSM 61 produces a sequence of codes that identify any specific chips as having a fault in the column being addressed. A possible code format is x bits + one tag bit where x is the width of the array, and the tag bit identifies a particular O to x chip address as the faulty XRAM. The MUX select bus (MSBUS) 65 transmits the x bits to the input multiplexer 75 and the output multiplexer 77. In many locations null codes (tag bit is zero) are encountered, however when a tag bit is valid data going to the XRAM defined by the value on MBUS, is copied into the spare XRAM 73 by selecting one of x bits via the input multiplexer. The DCSM 61 shown in FIG. 8 shows a 3-bit code plus one tag bit. A typical 8 bit wide look-up table could therefore handle XRAM arrays as wide as 128 chips.

The Remote Write mode provided by the XRAM is used to write only the defective column bit into the spare XRAM otherwise the spare would copy the good locations of the XRAM with the fault and hence the data stored by previous sparing would be overwritten. Accordingly the C line 69 connected to the spare XRAM is pulsed low at the appropriate time (in response to a valid tag bit) via gate 68. All the chips in the row will have been programmed to operate with a locally generated write enable (PMWT) when writing a block of data, whereas the spare chip will have been programmed to operate in Page Mode with Remote Write Mode. The XRAMs are programmed to assume particular modes before the start of data transfer.

Figure 9:
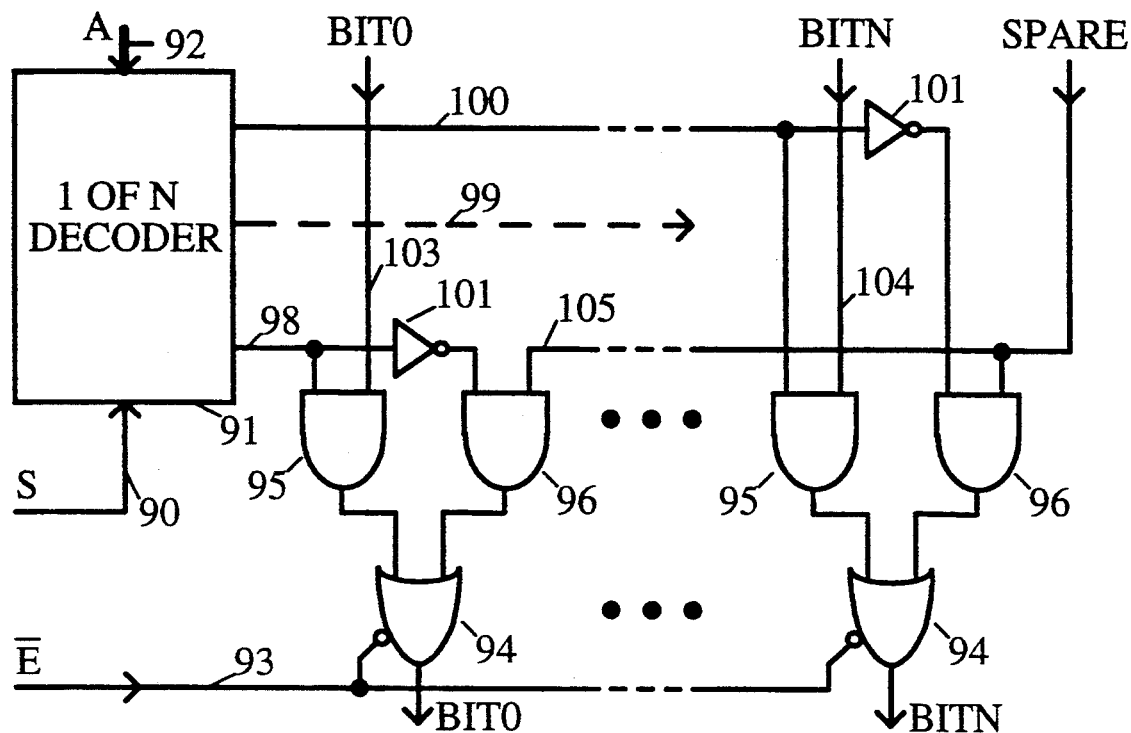
FIG. 9 shows an output multiplexer of FIG. 8.

During a read, the output of the faulty bit is replaced by the output of the spare chip via the output multiplexer 77. FIG. 9 illustrates the output multiplexer in more detail. This comprises a one-of-N decoder 91 which is supplied by inputs A 92 and S 90. A is connected to the MSBUS 65 and S the tag bit 66 from the DCSM. When S is low all outputs of the decoder are high. This is the normal situation, and bits from the array are directly connected to the data output bus. However when S is high, one of the N outputs is driven low thereby selecting the data stream from the spare bit 105. The data output is enabled by the board enable signal 93 connected to the ouput multiplexer.

Only one fault per MCC count is permitted. If the column address counters within each XRAM all started from the same location there is a danger that two or more faults in different XRAMS would occupy the same point in time, i.e. form a coincidence as discussed with reference to FIG. 2. Such coincidences cannot be recovered since there is only one logical column replacement (only one spare XRAM per array row). Therefore each chip has a different column sequence from other chips in the same row. The skew value for each chip is generated after physical faults have been determined, hence a substrate is manufactured, the array tested and then a skew generating algorithm is run on the fault maps of each XRAM.

Many algorithms can be developed for generating skew values. The simplest routines simply add a number to the first location of any fault (and the same number to all locations within the same cluster) and then re-examine the chip maps to see if the coincident fault has been avoided. If a coincidence still remains the same location (and those within the same cluster) is incremented again and the fault maps tested again, and so on until the incremented value exceeds the number of locations possible.

Once the skew numbers have been generated, they are stored as a table, the Skew Value Table (SVT) in the non-volatile memory on the substrate.

Figure 10:
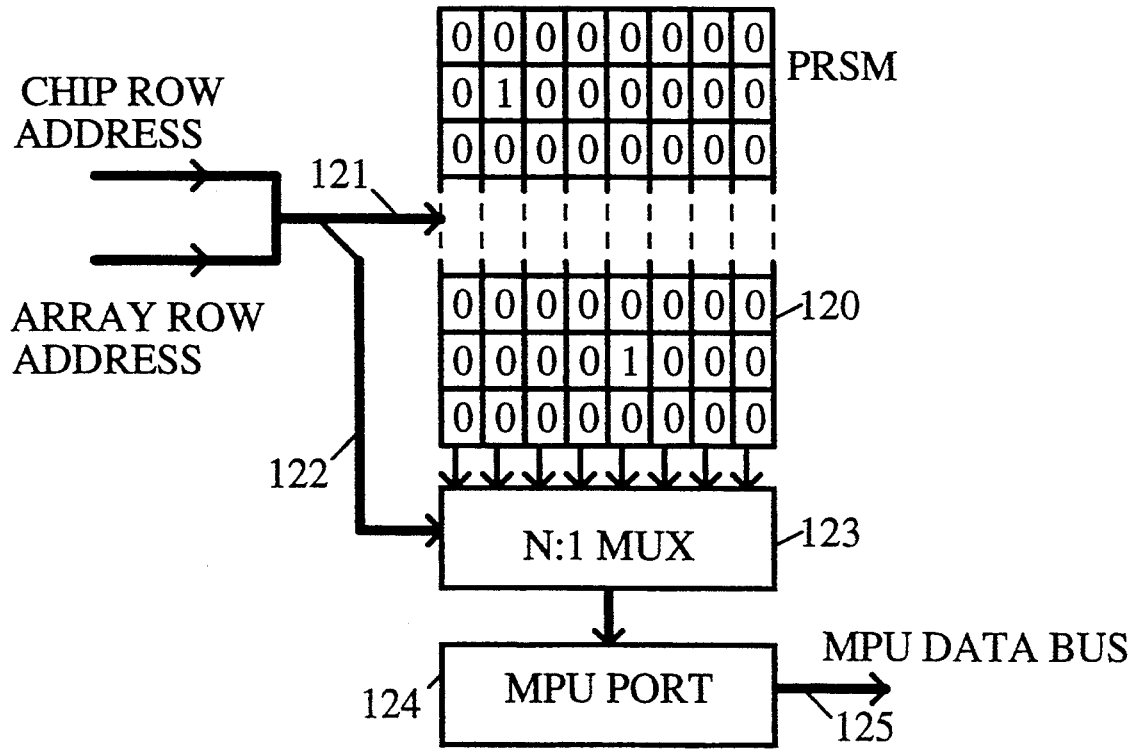
FIG. 10 is a diagram to explain further the principle of pre-emptive row sparing.

Pre-emptive row sparing (PRS) as the name implies happens before data transfer commences. PRS uses a look-up table, the pre-emptive row spare map (PRSM) which indicates whether a particular row is to be spared during the impending data transfer. FIG. 10 illustrates the PRSM 120 which is connected to a N-to-one multiplexer 123. Hence one byte in the PRSM covers up to 8 rows within XRAM. A microprocessor can read the output of the multiplexer 123 via the MPU port. In the event that the PRSM indicates row failure the microprocessor directs the data transfer to operate within the spare row of XRAMS. Due to the anti-coincidence technique (which in this case will skew the starting row address) described above, any faulty row in the main array is assured of a working row in the spare row of XRAMS. The PRS system uses a similar location skewing technique as used by the DCS system above. After manufacture row skew valus are programmed into a non-volatile SVT present on all substrates. The same algorithm used to generate the column skew values is used to generate row skew values.

Since the combination of DCS and PRS will produce a 100% storage capacity from the array the conversion of LBN to chip row address (CRA) row address (ARA) and substrate (SA) can be direct. For example if each substrate contains a 8×32 array, where each chip in the array has 1024 rows, and for a system of eight substrates, the LBN can be converted as follows:

Chip Row Address, CRA(9:0)=LBN(9:0)
Array Row Address, ARA(4:0)=LBN(14:10)
Substrate Address, SA(2:0)=LBN(16:15)
where: (x:y) represent bits x to y inclusive.

In such an example where a row was 1024 columns long, the LBN would resolve a data block of 1024 bytes in a range of two to the power of seventeen blocks, or 128 Megabytes. This direct conversion of LBN to the various physical addresses of the system results in a very short access time.

If the PRSM bit associated with the row selected by the LBN indicates a bad row, then the spare row of chips is invoked and ARA is invalid. CRA is then used to address the rows within the spare row of chips on the selected substrate.

Figure 11:
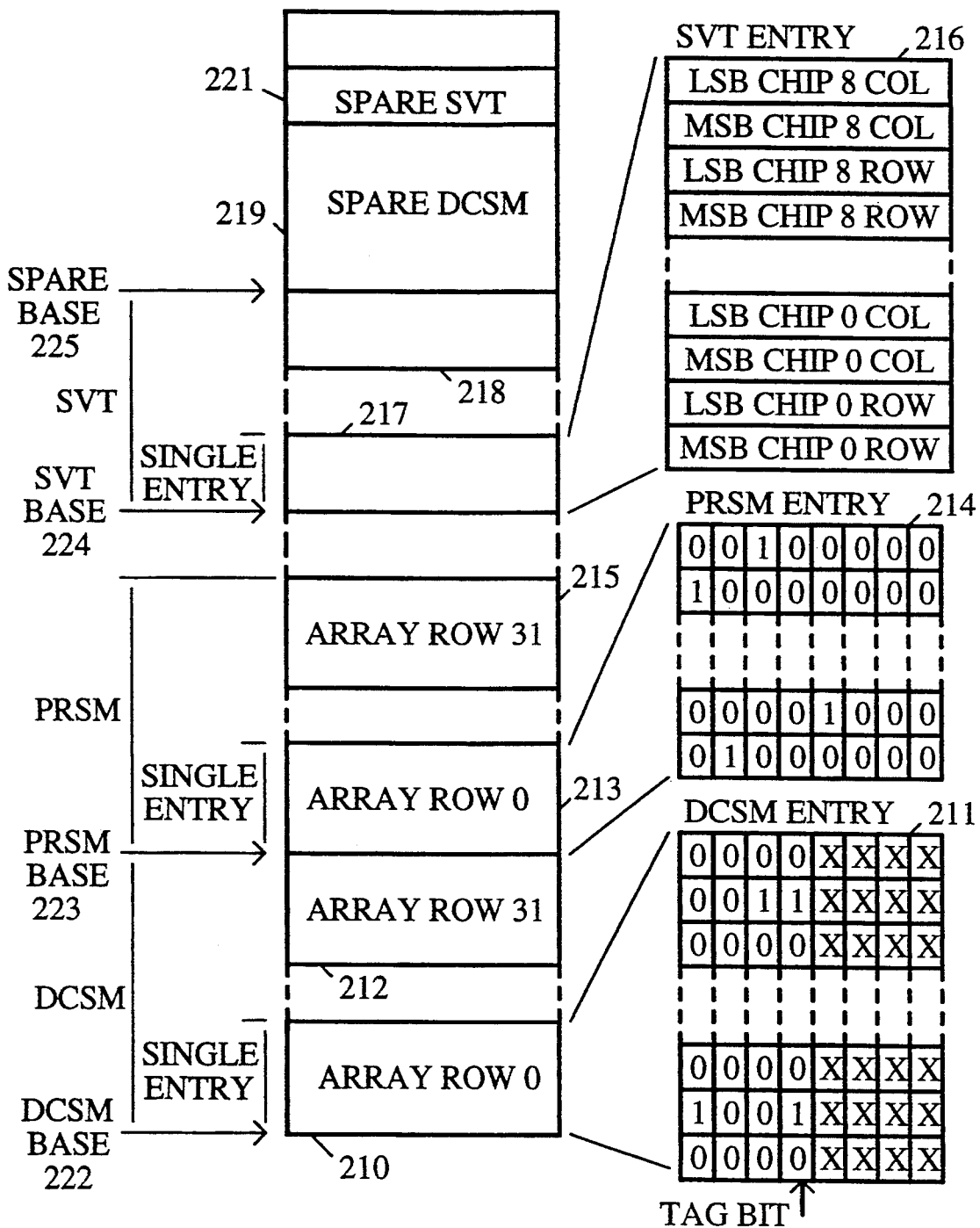
FIG. 11 shows a possible packing scheme for maps describing column and row faults and skew values.

All three look-up tables, the DCSM, PRSM and SVT, collectively forming the Map Memory, are stored in non-volatile memory on each XRAM substrate. FIG. 11 shows a possible storage arrangement using the following parameters; the array is organised as 8×32 XRAMs where each XRAM has 1024 rows and 1024 columns. ARA defines the row of chips, and CRA defines rows within individual XRAMS. FIG. 11 illustrates the memory map for the various tables. Entry 210 to 212 form the DCSM for the main array. The MCC 60 supplies column locations to address within each DCSM entry, and ARA selects which entry. ARA is added to the DCSM base address 222 to locate the DCSM, and address the required entry. Typical coding for a DCSM entry 211 is shown, with three MSBUS bits for 1 to 8 chips. There is no ninth entry in the DCSM since the anti-coincidental skewing guarantees there to be a useable column at the column selected by the MCC. In the event of a row fault being detected after reference to PRSM and ARA address is redundant and a single DCSM entry for the spare row is addressed via the spare base 225. For this example a DCSM entry is 1K bytes. PRSM entries are located using the sum of the PRSM base address and the ARA address. Since faulty rows are indicated by single bits in bytes the CRA is used to locate rows within PRSM entries. In this example the seven most significant bits of CRA will locate a byte in the PRSM, and the lowest three bits of CRA will determine which bit in that byte. There is no spare entry for the PRSM since the anti-coincidental skewing guarantees there to be a useable row at the row selected by CRA. An entry within the SVT is located by SVT base address 224 plus ARA. A typical entry is 4 bytes by 9 chips long (36 bytes) and a typical entry is shown as 216. The skew values for column or row are typically 16 bit words. In the event of a spare row the spare SVT is located either via the spare DCSM base or a separate base. The map memory will also be programmed with bases, table sizes, and various checksums. For the above example all the tables would occupy less than 64K bytes.

FIG. 12 shows more completely the first embodiment of storage system. The diagram is similar to FIG. 7 with HCIBUS 131 connected to memory mapped port 130 and system data controller SDC 132. Microprocessor, RAM and ROM form the same architecture as FIG. 7. The differences with respect to FIG. 7 are the XRAM substrate 137 and the system access controller SAC 153.

The data drivers on the substrate shown in FIG. 6 have been replaced by an input multiplexer IMUX 166 with integrated bus driving capability, and the output multiplexer OMUX 167. These multiplexers copy and redirect data respectively from the faulty XRAM in a row in the array 145 to an XRAM in the spare column 165. The IDC 150 supplies the necessary R and C lines (this includes the C line 149 to the spare column of XRAMS and the Remote Write gating is present but not shown since in practice this gating function would be integrated into the IDC) to the array and to spare columns and rows of XRAMs. The spare row of XRAMs 141 also has a spare column chip 164 so that DCS can be performed on faulty columns in the spare row. The substrate also contains the map 146 which is a non-volatile memory that stores the DCSM, PRSM and SVT. If high speed data transfer is required it is desirable to down-load the contents of the DCSM to a faster access time memory known as the high speed DCSM (HDCSM) 152. The one-of-N multiplexer used by the PRSM access mechanism in FIG. 10 is not shown for the sake of clarity. This multiplexer can be on the substrate or as a memory mapped port of the MPU. Alternatively the unpacking function provided by this multiplexer can be achieved in software.

Using the same parameters of previous examples an 8×32 array of 256 imperfect chips is made to appear perfect by the provision of one spare XRAM per array row (32 spare chips) and one spare row of XRAMs (8 spare chips). Due to the anti-coincidence skewing technique the spare chips can also be faulty. Furthermore since column sparing takes place on-the-fly there is no reduction in data rate. The need for column and row skew values to be programmed into the SAC results in a minor overhead for the access time of the storage system. Typically only row skews will be programmed regularly since column skews can be programmed once at system power-up.

The example shown in FIG. 12 shows the XRAM array and spares all on the same substrate. In practice the spares can be remote and simply operate on the data path between substrates and SDC provided that selection signals such as the C line with Remote Write enable are made available.

The embodiment which has been described can tolerate faulty columns in the spare chip of each array row as well as in the main chips of that row, with appropriate column address skewing to take account of all column faults in the array row. A faulty row in one of the main chips is managed by copying to a good row in the spare row of chips. The system can be modified to require just two perfect chips, one being a spare row chip for the spare column and the other being a spare column chip for the spare row. In this manner, if copying occurs to a faulty row in a chip of the spare column, this can be further copied to a row in the perfect spare row chip for the spare column. Similarly, if copying occurs to a faulty column in a chip of the spare row, this can be further copied to a column in the perfect spare column chip for the spare row.

In the second embodiment which will now be described, none of the chips need be perfect and the chips comprise conventional random access chips e.g. DRAM's. This second embodiment will now be described with reference to FIGS. 13 to 18.

Figure 13:
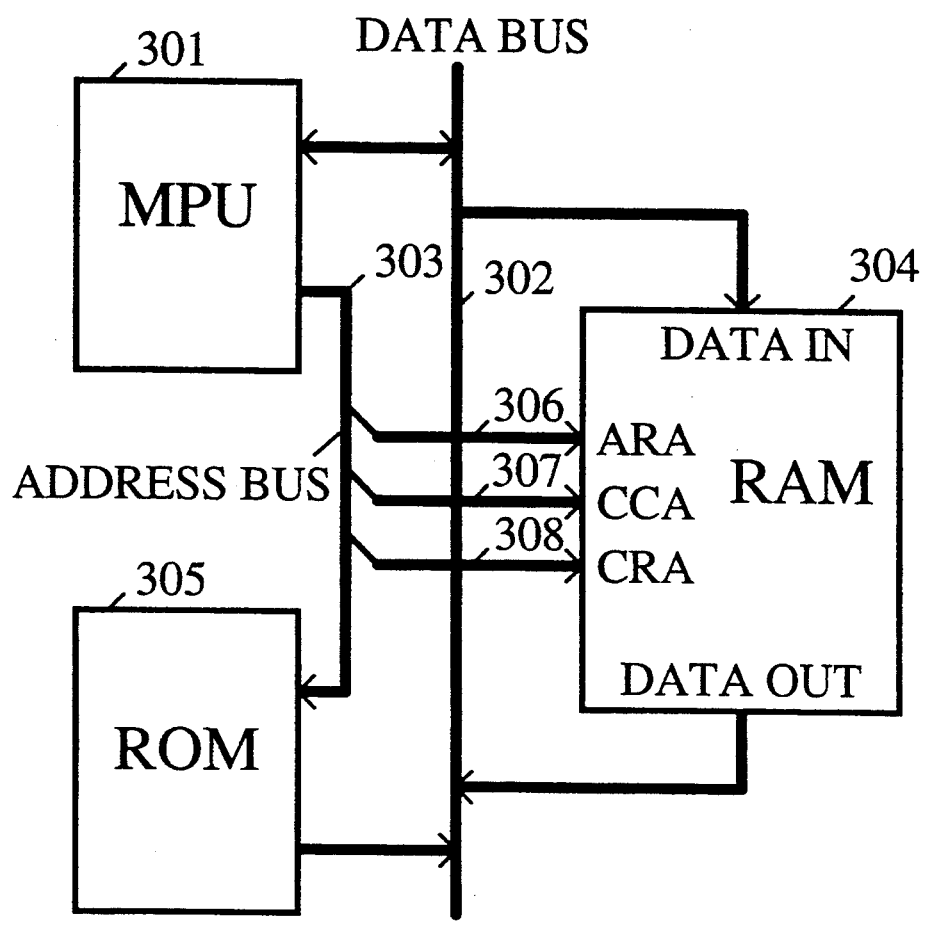
FIG. 13 shows a typical data storage system containing RAM.
Figure 14:
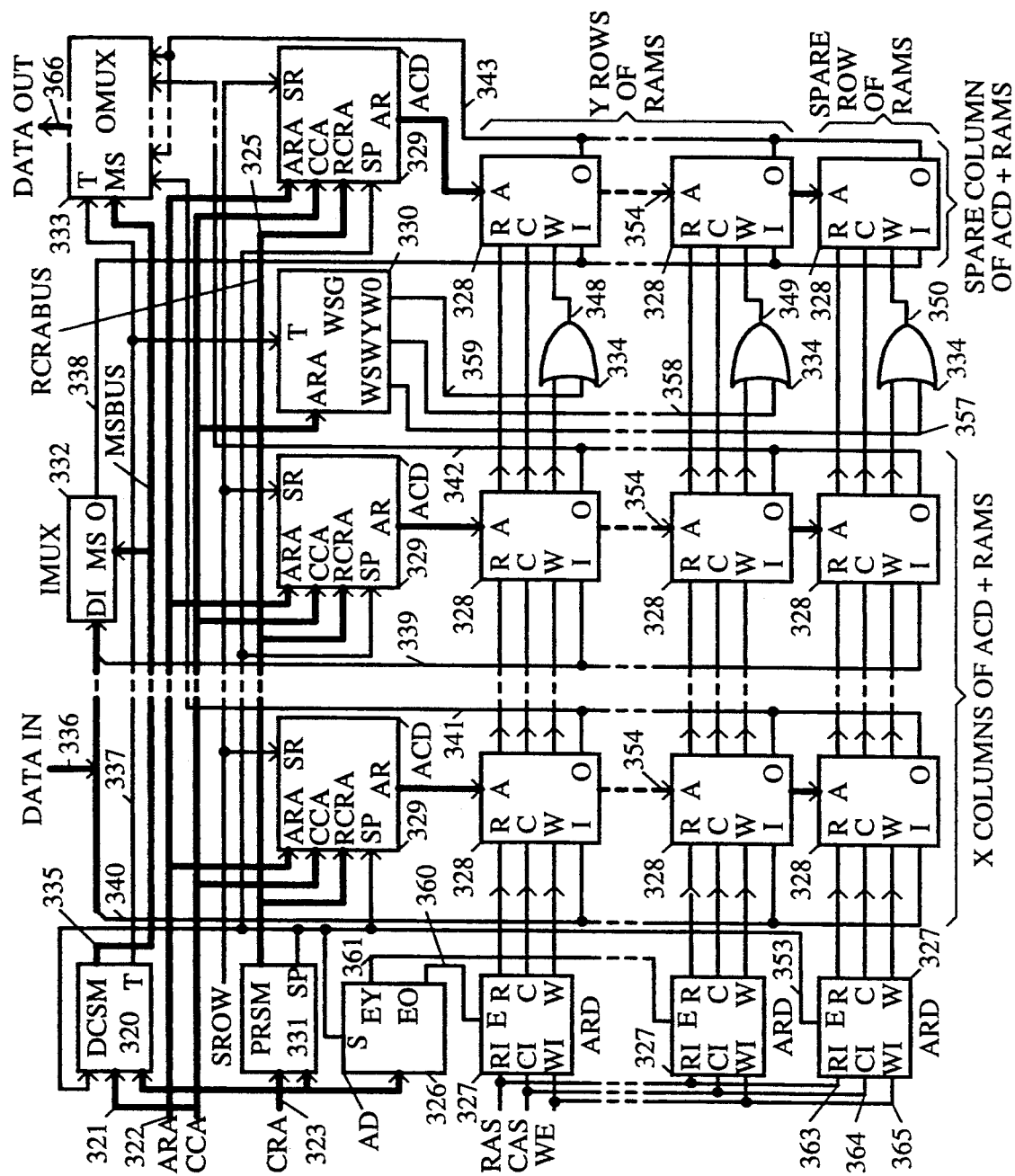
FIG. 14 shows a second embodiment of data storage system in accordance with this invention.

FIG. 13 illustrates a typical computer system comprising Microprocessor (MPU) 301 connected to memory, Read Only Memory (ROM) 305 and Random Access Memory (RAM) 304, through a bidirectional Data Bus 302 and an Address Bus 303. The address bus supplies three effectively separate address busses into the RAM. These are the Array Row Address (ARA) 306, the Chip Column Address (CCA) 307 and the Chip Row Address (CRA) 308. Control signals and peripheral circuits have been ignored in the interests of clarity. ARA defines which one of the plurality of array rows is to be accessed. CCA defines the column location to be addressed in the chips selected by ARA. CRA defines the row location to be addressed within the chips selected by ARA. All three busses are considered as logical addresses, since the action of the fault tolerancing circuit contained on the RAM printed circuit board is to modify these logical addresses to new physical addresses when faults are detected on-the-fly. FIG. 14 describes this circuit in more detail.

FIG. 14 shows the basic circuit of the fault tolerant random access memory system. The address busses ARA 322, CCA 321 and CRA 323 are shown and are equivalent to the busses shown in FIG. 13. Data In 336 and Data Out 366 are shown and are equivalent to those shown in FIG. 13. In the interests of clarity, typical data output enable, or board selection signals have not been shown since these are required by common practice. Furthermore only part of the main array is shown. Array columns associated with the least significant data bit 340 and most significant bit 339 are shown as representative of all array columns. Array rows associated with the least significant array row address decoded by the ARA Decoder (AD) 326 output EO 360 and the most significant array row address decoded by AD output EY 361 are shown as representative of all array rows.

FIG. 14 shows the two maps that define the faulty column and row locations, namely the Dynamic Column Sparing Map (DCSM) 320 and Pre-emptive Row Sparing Map (PRSM) 331 respectively. They are separated in order to reduce the system access time by accessing both in parallel. The DCSM supplies data defining which chip contains a faulty column at the CCA logical location. This data is carried by the MSBUS 335 to two multiplexers, IMUX 332 and OMUX 333. During a data write, if one of the chips in the selected array row is identified as exhibiting a column fault by the MSBUS and the event validated by the Tag bit T337 from the DCSM, data is copied from the identified bit in the Data In bus via the IMUX into the spare column of chips on data line 338. The Write Enable (WE) 365 signal is strobed by gate 334 so that only the faulty location is copied. This strobe is supplied to the selected row of the main array or the spare row by the Write Strobe Generator (WSG) 330. The WSG is a commonplace one-of-N decoder. During a data read operation the output of the spare chip is used to replace the bit stream from the faulty chip via the OMUX.

In the case of a faulty row, the PRSM can identify a particular row as defective by asserting the SP 353 line. This condition identifies a logical row as faulty and a replacement row location is supplied on the Replacement Chip Row Address Bus (RCRABUS) 325. The SP line enables the Array Row Driver (ARD) 327 for the spare row and disables the row requested by the ARA. When the spare row is not required the selected ARD is enabled by a one-of-N decoder, the ARD Decoder (AD) 326. If a faulty column is detected in the spare row by a 'spare row' entry in the DCSM normal column sparing takes place. The action of row replacement allows faulty rows to be present in the chips in the spare array row. The number of array rows (Nar) that can be managed is given by:

$$Nar = INT(Rmax/(W*F)) - 1 \qquad (1)$$

where;
Rmax = No. of row locations per chip,
W = No. of bits pr array row,
F = No. of faulty row locations per chip.

Equation (1) is worst case since the ($W * F$) term is ameliorated by faults that occur at the same row location in different chips of the same array row.

Each column of chips in the array is controlled by an Array Column Driver (ACD) 329 as shown in FIG. 14. The ACD supplies the addresses required by the column of chips to which it is connected. The memory chips are shown as Dynamic Random Access Memories (DRAMs) 328. Each chip is supplied with addresses which are multiplexed by the ACD into row address and column address phases and supplied by the Address Bus AB 354. These phases are identified by the assertion of the Row Address Strobe (RAS) 363 and Column Address Strobe (CAS) signals respectively. All DRAMs use a multiplexed address bus, and standard sequences of RAS and CAS timing and will not be described further herein. Each array row is supplied by data inputs 340 to 339 (least significant bit and most significant bit respectively). Each column of chips has a common output 341 to 342 (least and most significant respectively).

FIG. 14 does not show the programming data path for the ACD's in the interest of clarity. The column skew values are stored in the DCSM and are programmed into the ACDs with the assistance of the system microprocessor when the system is powered up. Alternatively each ACD may comprise a non-volatile memory permanently storing the column skew values.

Figure 15:
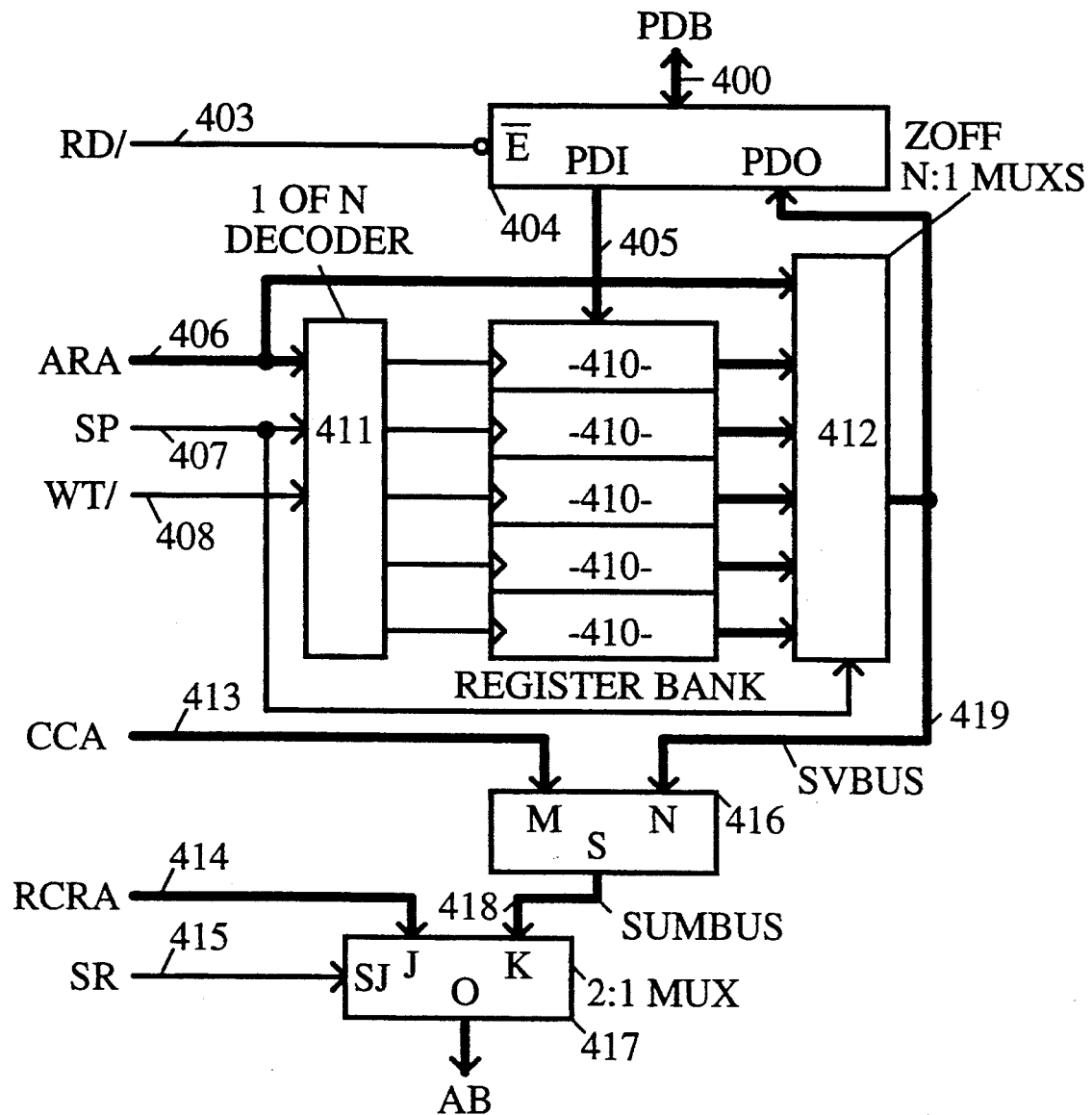
FIG. 15 shows an array column driver of the system of FIG. 14.

FIG. 15 describes the ACD in more detail. Since row replacement takes place before data transfer takes place it is only necessary to provide a means of transmitting the row address to the DRAMs via the Z way 2:1 multiplexer 417 where Z represents the number of row or column locations in any RAM chip (it is usual for there to be the same number of row and column locations. The Select Row (SR) signal 415 selects the RCRA bus input as the data source via the multiplexer. The RCRA data has already been transformed by the action of the PRSM map if a row is to be replaced. Normal operation of conventional DRAMs supply row addresses first, followed by column addresses. The column address is supplied by the CCA bus 413 in FIG. 15. In order to prevent coincidental faults (faults at the same CCA location in different chips in the same array row) the CCA value is added to the skew value for the chip selected. The full adder 416 adds together the CCA and contents of one of the registers contained in the Register Bank 410. Each register is Z bits wide. The resulting sum is supplied to the address multiplexer 417 via the SUMBUS 418. The use of the adder skews the logical column address on-the-fly to avoid fault coincidences. When column addresses are required by the DRAMs the SR signal selects the SUMBUS as the source of address value.

Each column of chips is provided with one ACD. Each chip in the array column is given a column skew value which is stored in one of the registers in the bank. The ARA bus selects which register is required via a Z way N-to-1 multiplexer 412 where N represents the number of rows in the array plus one. This multiplexer supplies the SVBUS 419 which selects the contents of one of the registers in the bank. The SVBUS also supplies a read back facility to confirm correct programming via the Progamming Data Bus (PDB) 400. The PDB also supplies the data during a register write operation. Typically the register bank is programmed by the system microprocessor at system power up and the registers are written and verified in sequence by supplying the appropriate data on the PDB and selecting the register by the value on the ARA. After the main array skew values have been programmed a known faulty row is accessed and this allows the programming of the registers associated with the spare array row by asserting the SP signal 407.

Output data (341 to 343) from the array is routed to the output multiplexer (OMUX) in FIG. 14. This is shown in more detail in FIG. 16. A selected chip drives the output bus hence normal and replacement row data is resolved by having only one ARD active at a time. These data busses feed the OMUX as bit 0 432 to bit X 440. A plurality of 2:1 multiplexers formed from gates 436, 437 and 438 select data from the array (bit 0 to X). In the case of a faulty column the T signal 435 selects one of the X outputs of decoder 430 to replace the array data with data from the spare column of chips. The particular bit to replace is defined by the MS input 431 via the MSBUS.

Figures 16, 17:
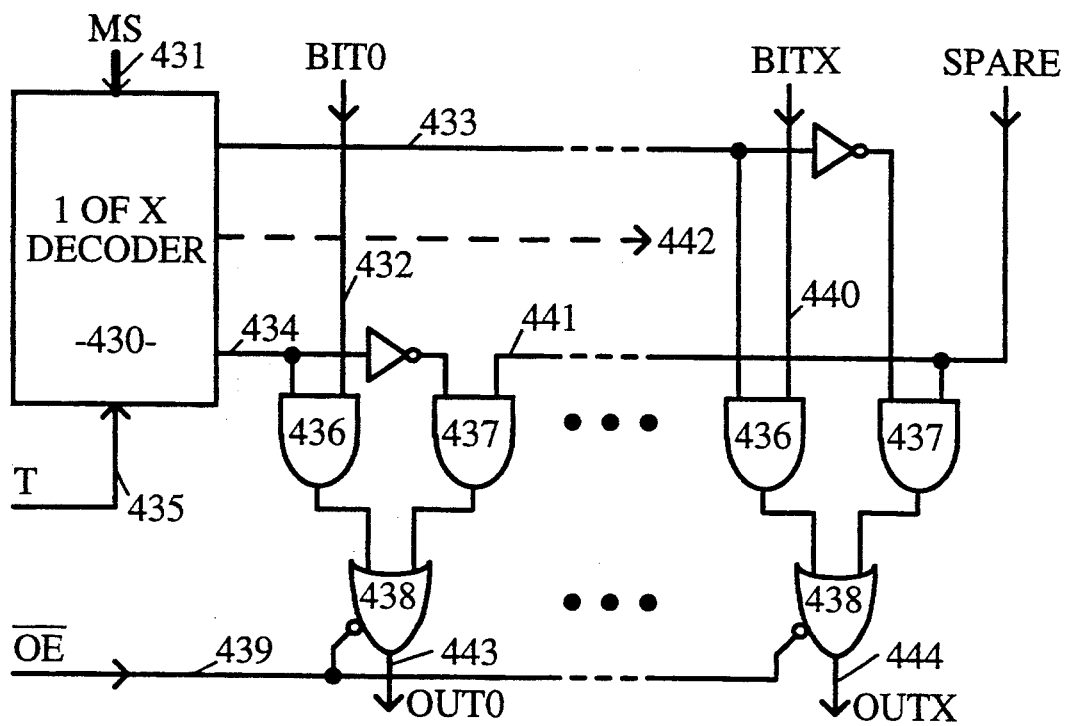
FIG. 16 shows an output multiplexer of the system of FIG. 14.
FIG. 17 shows a format for the pre-emptive row sparing map.

The DCSM, SVT and PRSM are stored in non-volatile memory. This is typically on the same printed circuit board as are the DRAMs to which the map refers. The PRSM is typically in a separate memory to facilitate parallel reading of map contents. The contents of a typical PRSM is shown in FIG. 17. The PRSM is addressed by ARA and CRA shown in hexadecimal notation 450. In the case of a faulty row the address of the row that replaces the faulty one is contained in the RCRABUS field 451 as shown in FIG. 17. A faulty row is identified by the SP 452 bit typically set to a logical one. Where no fault exists the SP bit is zero and the original CRA is programmed into the map to eliminate the need for an external multiplexer.

Figure 18:
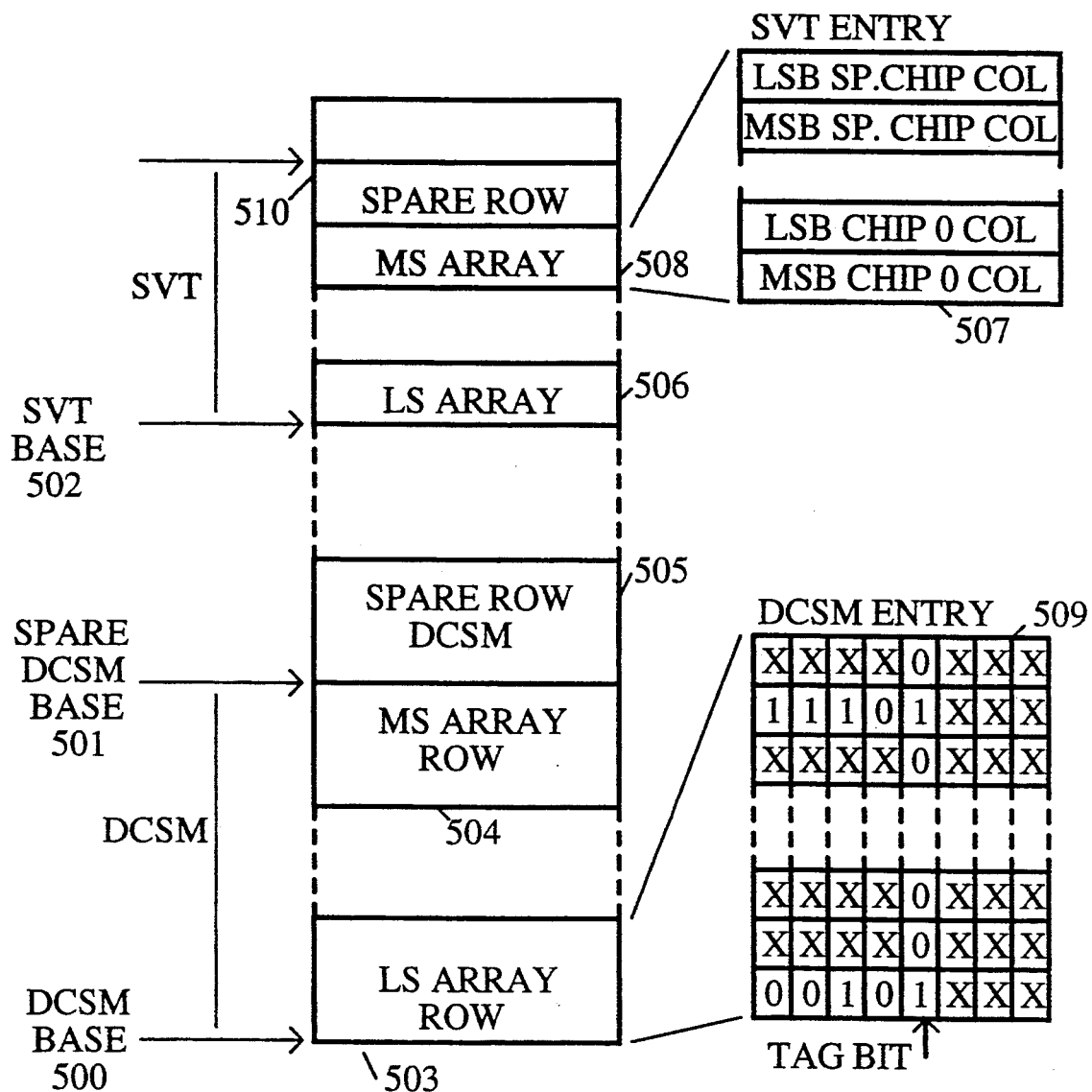
FIG. 18 shows a format for the dynamic column sparing map.

A typical format for the DCSM is shown in FIG. 18. The DCSM is accessed by the combination of the DCSM base address 500 plus ARA and CCA. In the case of the spare array row being accessed the SP line overrides the value of ARA. A typical example of the DCSM contents is shown as 509 in FIG. 18. The TAG bit identifies a specific location as faulty. the SVT is accessed by the SVT base address 502 plus ARA to identify specific array row entries. For example if the array was 16 bits wide then there would be 16+1 entries in the SVT for a particular array row. Since it is required to read the SVT and program the ACD with the values contained within the SVT it is necessary to provide computer access to the DCSM map. This is not shown in the drawing but is simple in practice through the use of a memory mapped port which can read the contents of the DCSM while changing the address of the DCSM via CCA and ARA.

Preferaby a separate DCSM is provided for the spare row of chips and is accessed in parallel with the DCSM for the main array and with the PRSM. This reduces the access time by avoiding the need to first access the PRSM and then the DCSM. Preferably also, each ACD includes a second full adder arranged to generate CCAs for the spare row of chips in parallel with the generation of CCAs for the selected array row: the SP signal from the PRSM is used to select the output from the first or second adder as appropriate.

Preferably after each memory chip is manufactured, it is automatically tested to locate its fault locations. The test equipment then produces a printed record of the fault locations, which record is then packaged with the chip. The printed record is readable by an optical read-out machine and may be printed directly onto the chip or onto a label which may then be adhered to the chip.

I claim:

1. A fault tolerant data storage system comprising:
   a) a plurality of primary integrated circuits;
   b) a spare integrated circuit having a data terminal, each of said primary and spare integrated circuits comprising an array of memory locations arranged in rows and in columns, random of said integrated circuits having random columns which are faulty;
   c) a plurality of data line means connected to respective of said primary integrated circuits for writing data to or reading data from said primary integrated circuits in parallel;
   d) means for generating logical column addresses one-at-a-time;
   e) programmable electronic means for converting each logical column address to a set of physical column addresses, one for each primary integrated circuit and one for said spare integrated circuit, at least some of said logical column addresses of each set being skewed relative to each other and relative to the corresponding physical column address such that, for each logical column address, no two faulty columns have the same logical column address and said logical column address of each faulty column corresponds to a same logical column address of said spare integrated circuit;
   f) first identifying means for identifying which of said primary integrated circuits has a faulty column at the physical column address generated for that primary integrated circuit; and
   g) electronically controllable means responsive to said first identifying means for connecting the data line means for that integrated circuit to said data terminal of the spare integrated circuit.

2. A fault tolerant data storage system as claimed in claim 1, wherein said plurality of primary integrated circuits comprises an array of main integrated circuits arranged in rows and columns, each row of main integrated circuits having a spare integrated circuit, said storage system further comprising:
   h) a plurality of column spare integrated circuits with one for each said column of main integrated circuits, each said column spare integrated circuit also comprising an array of memory locations arranged in rows and columns, random of said main and spare column integrated circuits having random rows which are faulty, each said data line means being connected to all integrated circuits of an associated column and the spare integrated circuit of that column;
   i) means for selecting said rows of main integrated circuits one-at-a-time;
   j) means for generating memory location row addresses one-at-a-time;
   k) programmable electronic means for converting any said row address of a faulty row to an address of a non-faulty row in the column spare integrated circuits;
   l) second identifying means for identifying when said faulty memory location row is being addressed; and
   m) electronically controllable means responsive to said second identifying means for enabling the connection of the data line means to the column spare integrated circuits instead of the selected row of the main integrated circuits.

3. A fault tolerant data storage system as claimed in claim 2, further comprising:
   n) an additional spare integrated circuit for said column spare integrated circuits to replace any faulty memory location columns in said column spare integrated circuits.

4. A fault tolerant data storage system as claimed in claim 1, wherein:
   said identifying means comprises a look-up table addressed by said logical column address generating means.

5. A fault tolerant data storage system as claimed in claim 2, wherein:
   said first and second identifying means comprise respective look-up tables which are addressed in parallel.

6. A fault tolerant data storage system as claimed in claim 1, wherein:
   said means for converting each said logical column address to a set of physical column addresses comprises programmable electronic means storing a set of skew values and a set of fast adders arranged to add respective said skew values to the logical column address.

7. A fault tolerant data storage system comprising:
   a) a plurality of primary integrated circuits;
   b) a spare integrated circuit having a data terminal, each of said primary and spare integrated circuits comprising an array of memory locations arranged in rows and in columns, random of said integrated circuits having random rows which are faulty;
   c) a plurality of data line means connected to respective said primary integrated circuits for writing data to or reading data from said primary integrated circuits in parallel;
   d) means for generating logical row addresses one-at-a-time;
   e) programmable electronic means for converting each logical row address to a set of physical row addresses, one for each primary integrated circuit and one for said spare integrated circuit, at least some of said logical row addresses of each set being skewed relative to each other and relative to the corresponding physical row address such that, for each logical row address, no two faulty rows have the same logical row address and said logical row address of each faulty row corresponds to a same logical row address of said spare integrated circuit;

f) first identifying means for identifying which of said primary integrated circuits has a faulty row at the physical row address generated for that primary integrated circuit; and g) electronically controllable means responsive to said first identifying means for connecting the data line means for that integrated circuit to said data terminal of the spare integrated circuit.

8. A fault tolerant data storage system as claimed in claim 7, wherein said plurality of primary integrated circuits comprises an array of main integrated circuits arranged in rows and columns, each row of main integrated circuits having a spare integrated circuit, said storage system further comprising:

h) a plurality of column spare integrated circuits with one for each said column of main integrated circuits, each said column spare integrated circuit also comprising an array of memory locations arranged in rows and columns, random of said main and spare column integrated circuits having random rows which are faulty, each said data line means being connected to all integrated circuits of an associated column and the spare integrated circuit of that column;

i) means for selecting said rows of main integrated circuits one-at-a-time;

j) means for generating memory location column addresses one-at-a-time;

k) programmable electronic means for converting any said column address of a faulty column to an address of a non-faulty column in the column spare integrated circuits;

l) second identifying means for identifying when said faulty memory location column is being addressed; and m) electronically controllable means responsive to said second identifying means for enabling the connection of the data line means to the column spare integrated circuits in stead of the selected row of the main integrated circuits.

* * * * *